United States Patent
Park et al.

(10) Patent No.: US 11,732,217 B2
(45) Date of Patent: Aug. 22, 2023

(54) CLEANING SOLUTION COMPOSITION AND CLEANING METHOD USING THE SAME

(71) Applicant: KCTECH CO., LTD., Gyeonggi-do (KR)

(72) Inventors: Kun Hee Park, Gyeonggi-do (KR); Yong Ho Jeong, Gyeonggi-do (KR); Kyong Jin Jung, Gyeonggi-do (KR); Young Ho Yun, Gyeonggi-do (KR)

(73) Assignee: KCTECH CO., LTD., Gyeonggi-do (KR)

( * ) Notice: Subject to any disclaimer, the term of this patent is extended or adjusted under 35 U.S.C. 154(b) by 26 days.

(21) Appl. No.: 17/381,211

(22) Filed: Jul. 21, 2021

(65) Prior Publication Data

US 2022/0025299 A1    Jan. 27, 2022

(30) Foreign Application Priority Data

Jul. 23, 2020   (KR) .................. 10-2020-0091390

(51) Int. Cl.
| | | |
|---|---|---|
| C11D 7/32 | (2006.01) | |
| C11D 3/24 | (2006.01) | |
| C11D 3/00 | (2006.01) | |
| C11D 1/40 | (2006.01) | |
| H01L 21/304 | (2006.01) | |
| C11D 11/00 | (2006.01) | |
| H01L 21/306 | (2006.01) | |
| H01L 21/321 | (2006.01) | |
| C11D 3/37 | (2006.01) | |

(52) U.S. Cl.
CPC ............... *C11D 3/245* (2013.01); *C11D 1/40* (2013.01); *C11D 3/0047* (2013.01); *C11D 3/3773* (2013.01); *C11D 11/0047* (2013.01); *H01L 21/304* (2013.01); *H01L 21/306* (2013.01); *H01L 21/3212* (2013.01)

(58) Field of Classification Search
CPC .................................................. C11D 11/0047
USPC ........................................................ 510/175
See application file for complete search history.

(56) References Cited

U.S. PATENT DOCUMENTS

| | | | |
|---|---|---|---|
| 2006/0154839 A1* | 7/2006 | Ilardi .................. | C11D 11/0047 510/175 |
| 2006/0270573 A1* | 11/2006 | Ikemoto ............. | C11D 11/0047 134/2 |
| 2020/0199500 A1 | 6/2020 | White et al. | |

FOREIGN PATENT DOCUMENTS

| | | |
|---|---|---|
| CN | 1656206 | 8/2005 |
| CN | 1918698 | 2/2007 |
| CN | 101228481 | 7/2008 |
| CN | 103777475 | 5/2014 |
| CN | 104508072 | 4/2015 |
| KR | 20080098772 | 11/2008 |
| KR | 20200038014 | 4/2020 |
| KR | 20200077912 | 7/2020 |
| TW | 201209156 | 3/2012 |

* cited by examiner

*Primary Examiner* — Gregory E Webb
(74) *Attorney, Agent, or Firm* — JCIPRNET

(57) ABSTRACT

A cleaning solution composition and a cleaning method using the cleaning solution composition are provided. The cleaning solution composition includes a chelating agent including a first organic acid and a second organic acid, and an etching agent including a fluoride compound.

15 Claims, 2 Drawing Sheets

CLEANING SOLUTION COMPOSITION AND CLEANING METHOD USING THE SAME

CROSS-REFERENCE TO RELATED APPLICATION(S)

This application claims the benefit of Korean Patent Application No. 10-2020-0091390, filed on Jul. 23, 2020, in the Korean Intellectual Property Office, the disclosure of which is incorporated herein by reference.

BACKGROUND

1. Field of the Invention

One or more example embodiments relate to a cleaning solution composition and a cleaning method using the cleaning solution composition.

2. Description of the Related Art

Recently, due to the miniaturization of semiconductor devices, a high precision is required for flatness of each layer of a substrate. In addition, to increase an efficiency of production, a technology for simultaneously planarizing surfaces with different hardness or properties is required.

Generally, chemical mechanical polishing (CMP) is used as a technology for ensuring flatness of a substrate for a semiconductor device. The CMP is a technology for polishing and planarizing a surface of a substrate using a polishing pad while supplying an abrasive including abrasive particles. As an abrasive, a silica slurry that uses silica particles as abrasive particles and a ceria slurry that uses ceria particles as abrasive particles are being widely used. The silica slurry is mainly used to polish metals such as copper and silicon dioxide, and the ceria slurry is used to polish silicon dioxide and silicon nitride.

After a polishing process is performed using an abrasive such as a silica slurry or a ceria slurry, a cleaning process is required to remove polishing debris, particles, organic residues, or by-products, remaining on the surface of the substrate.

After a CMP process is performed using a ceria slurry, cleaning with hydrofluoric acid is typically performed to remove ceria that is abrasive particles remaining on the surface of the substrate. However, due to extremely strong solubility of a thermal oxide film, scratches or surface defects may occur, which may have an influence on a process subsequent to the cleaning and cause a decrease in yield and quality of a semiconductor device. In addition, if diluted hydrogen fluoride (DHF) is used, an etching effect for an oxide film may not be great.

Therefore, there is a need to develop a cleaning solution that may reduce an occurrence of defects while effectively removing residues after a CMP process by replacing hydrogen fluoride.

The above description has been possessed or acquired by the inventor(s) in the course of conceiving the present disclosure and is not necessarily an art publicly known before the present application is filed.

SUMMARY

To solve the above-described problems, an aspect is to provide a cleaning solution composition and a cleaning method using the cleaning solution composition, which may reduce an occurrence of defects while effectively removing residues in a cleaning process after a polishing process is performed using ceria particles.

However, aspects of the present disclosure are not limited to the one set forth herein, and other aspects not mentioned herein would be clearly understood by one of ordinary skill in the art from the following description.

According to an aspect, there is provided a cleaning solution composition including a chelating agent including a first organic acid and a second organic acid, and an etching agent including a fluoride compound.

The first organic acid may include a carboxyl group or a sulfonic acid group, and the second organic acid may include a phosphoric acid group.

The first organic acid may be present in an amount of 1% by weight (wt %) to 10 wt %, and the second organic acid may be present in an amount of 0.01 wt % to 5 wt %.

The first organic acid may include at least one of malic acid, malonic acid, adipic acid, succinic acid, tartaric acid, glutaric acid, glycolic acid, aspartic acid, itaconic acid, glutamic acid, tricarballylic acid, pimelic acid, suberic acid, sebacic acid, stearic acid, pyruvic acid, acetoacetic acid, glyoxylic acid, azelaic acid, fumaric acid, glutaconic acid, traumatic acid, muconic acid, aconitic acid, carballylic acid, tribasic acid, mellitic acid, isocitric acid, citric acid, lactic acid, gluconic acid, maleic acid, ascorbic acid, iminoacetic acid, oxalic acid, pyrogallic acid, formic acid, acetic acid, propionic acid, butyric acid, valeric acid, hexanoic acid, heptanoic acid, caprylic acid, nonanoic acid, decanoic acid, undecylenic acid, lauric acid, tridecylic acid, myristic acid, pentadecanoic acid, palmitic acid, sulfamic acid, salicylic acid, p-toluenesulfonic acid, polystyrenesulfonic acid, 2-naphthalene sulfonic acid, polyvinylsulfonic acid, dodecylbenzenesulfonic acid, 4-hydroxybenzenesulfonic acid, methylsulfonic acid, and nitrobenzenesulfonic acid.

The second organic acid may include at least one of ethylidenediphosphonic acid, 1-hydroxyethylidene-1,1'-diphosphonic acid (HEDP), 1-hydroxypropylidene-1,1'-diphosphonic acid, 1-hydroxybutylidene-1,1'-diphosphonic acid, ethylaminobis(methylenephosphonic acid), dodecylaminobis(methylenephosphonic acid), 2-phosphono-butane-1,2,4-tricarboxylic acid (PBTC), nitrilotris(methylenephosphonic acid) (NTPO), ethylenediaminebis(methylenephosphonic acid) (EDDPO), 1,3-propylenediaminebis(methylenephosphonic acid), ethylenediaminetetra(methylenephosphonic acid) (EDTPO), ethylenediaminetetra(ethylenephosphonic acid), 1,3-propylenediaminetetra(methylenephosphonic acid) (PDTMP), 1,2-diaminopropanetetra(methylenephosphonic acid), 1,6-hexamethylenediaminetetra(methylenephosphonic acid), hexadiaminetetra(methylenephosphonic acid), diethylenetriaminepenta(methylenephosphonic acid) (DEPPO), diethylenetriaminepentakis(methylphosphonic acid), N,N,N',N'-ethylenediaminetetra(methylenephosphonic acid), diethylenetriaminepenta(ethylenephosphonic acid), triethylenetetraminehexa(methylenephosphonic acid), and triethylenetetraminehexa(ethylenephosphonic acid).

The fluoride compound may include at least one of ammonium bifluoride, ammonium fluoride, sodium fluoride, barium fluoride, calcium fluoride, magnesium fluoride, potassium fluoride, aluminum fluoride, aminobenzotrifluoride, boron trifluoride, and cobalt fluoride.

The etching agent may be present in an amount of 0.1 wt % to 15 wt %.

The cleaning solution composition may further include an anionic surfactant including a sulfonate or a phosphate. The anionic surfactant may be present in an amount of 0.01 wt % to 10 wt %.

The sulfonate may include at least one of alkyl aryl sulfonate, alkylether sulfonate, alkyl sulfonate, arylsulfonate, polystyrene sulfonate, alkanesulfonate, α-olefin sulfonate, dodecylbenzenesulfonate, and alkylbenzenesulfonate.

The phosphate may include at least one of alkyl aryl phosphate, alkyl ether phosphate, aryl ether phosphate, alkyl phosphate, aryl phosphate, and benzene phosphate.

The cleaning solution composition may further include a pH adjusting agent. The pH adjusting agent may include at least one of alkanolamine and hydroxylamine.

The pH adjusting agent may include at least one of monoethanolamine (MEA), mono-n-propanolamine, monoisopropanolamine, mono-n-butanolamine, monopentanolamine, monohexanolamine, monoheptanolamine, monooctanolamine, monononanolamine, monodecanolamine, diethanolamine (DEA), dipropanolamine, diisopropanolamine (DIPA), dibutanolamine, dipentanolamine, dihexanolamine, diheptanolamine, dioctanolamine, dinonanolamine, didecanolamine, N-methyldiethanolamine (MDEA), triethanolamine (TEA), triisopropanolamine (TIPA), tripentanolamine, trihexanolamine, triheptanolamine, trioctanolamine, trinonanolamine, tridecanolamine, 2-amino-2-methyl-propanol (AMP), 1-aminoisopropanol (AIP), 2-amino-1-propanol, N-methylaminoethanol (N-MAE), 3-amino-1-propanol, 4-amino-1-butanol, 2-(2-aminoethoxy)-1-ethanol (AEE), and 2-(2-aminoethylamino)-1-ethanol.

pH of the cleaning solution composition may range from 2 to 7.

Cleaning may be performed after a surface of a wafer for a semiconductor device including at least one of a silicon nitride film and a silicon oxide film is polished.

The cleaning solution composition may be used for cleaning after polishing is performed using a chemical mechanical polishing (CMP) slurry including ceria.

According to another aspect, there is provided a cleaning method including cleaning a wafer for a semiconductor device using the cleaning solution composition after CMP of the wafer.

The cleaning solution composition may be free of hydrogen fluoride.

Additional aspects of example embodiments will be set forth in part in the description which follows and, in part, will be apparent from the description, or may be learned by practice of the disclosure.

According to example embodiments, a cleaning solution composition may include an etching agent including a fluoride compound, and thus an etching effect may be applied to a surface again during cleaning after a polishing process, to maximize cleaning performance and reduce a film loss and surface defects.

In addition, according to example embodiments, a cleaning method may exhibit relatively high cleaning performance, compared to when a cleaning process is performed using a hydrofluoric acid and standard cleaning 1 (SC1) that are generally used as a cleaning solution. Also, the cleaning method may reduce a film loss and surface defects.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
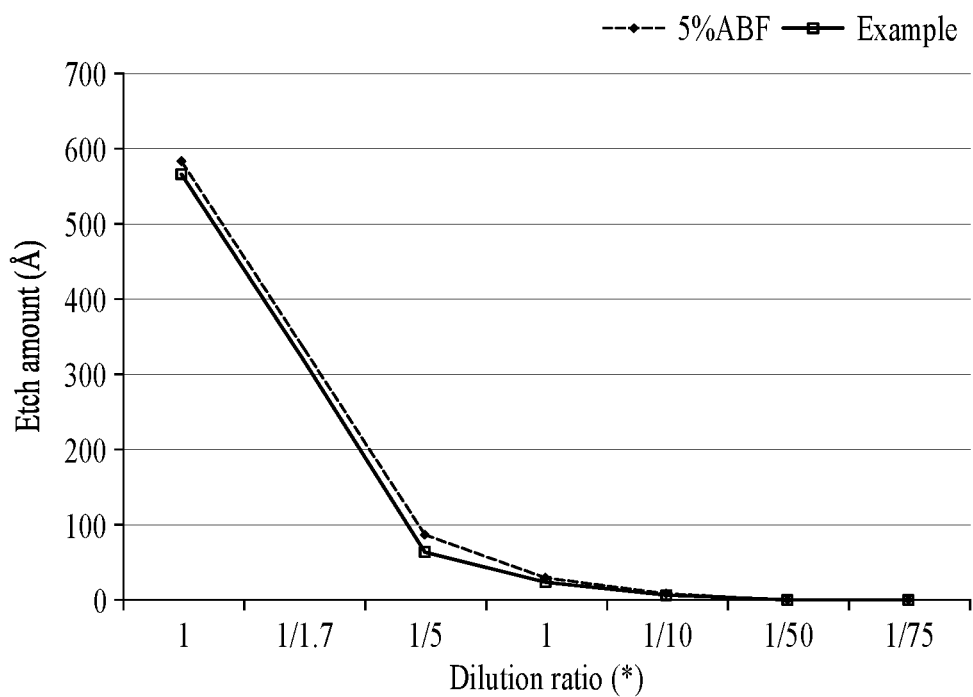
FIG. 1 is a graph illustrating an etch amount according to a dilution ratio of 5% by weight (wt %) of an ammonium bifluoride (ABF) solution and a cleaning solution composition of Example 1-3 at room temperature.

Hereinafter, example embodiments of the present disclosure will be described in detail with reference to the accompanying drawings. However, various alterations and modifications may be made to the example embodiments. Here, the example embodiments are not construed as limited to the disclosure and should be understood to include all changes, equivalents, and replacements within the idea and the technical scope of the disclosure.

The terminology used herein is for the purpose of describing particular example embodiments only and is not to be limiting of the example embodiments. As used herein, the singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of example embodiments, detailed description of well-known related technologies will be omitted when it is deemed that such description will cause ambiguous interpretation of the present disclosure.

Also, the terms "first," "second," "A," "B," "(a)," "(b)," and the like may be used herein to describe components according to example embodiments. Each of these terminologies is not used to define an essence, order or sequence of a corresponding component but used merely to distinguish the corresponding component from other component(s). It should be noted that if it is described in the specification that one component is "connected", "coupled", or "joined" to another component, a third component may be "connected", "coupled", and "joined" between the first and second components, although the first component may be directly connected, coupled or joined to the second component.

A component having a common function with a component included in one example embodiment is described using a like name in another example embodiment. Unless otherwise described, description made in one example embodiment may be applicable to another example embodiment and detailed description within a duplicate range is omitted.

According to an aspect, a cleaning solution composition may be provided. The cleaning solution composition may include a chelating agent including a first organic acid and a second organic acid, and an etching agent including a fluoride compound.

Since the etching agent including the fluoride compound is included in the cleaning solution composition, the cleaning solution composition may have an effect of reducing surface defects and a loss of a film to be polished while increasing cleaning performance by applying an etching effect to a surface again during cleaning after a polishing process.

In the cleaning solution composition, the chelating agent may be used to prevent contamination by metal caused by a polishing slurry or abrasive particles. In other words, metal contaminants from a polishing slurry or abrasive particles may react with the chelating agent to form a complex compound, and thus metal contaminants on a surface of a wafer for a semiconductor device may be effectively removed.

In an example, cerium ions remaining after a chemical mechanical polishing (CMP) process is performed using a polishing slurry including ceria particles may form a complex compound by reacting with the chelating agent, to be effectively removed.

The chelating agent may include two or more types of organic acids, which may facilitate a formation of a complex compound by reacting with metal ions remaining on a surface. Thus, metal contaminants may be effectively removed.

The first organic acid may include a carboxyl group or a sulfonic acid group, and the second organic acid may include a phosphoric acid group.

The first organic acid may be present in an amount of 1% by weight (wt %) to 10 wt %, and the second organic acid may be present in an amount of 0.01 wt % to 5 wt %.

The first organic acid may desirably be present in an amount of 2 wt % to 8 wt %, and the second organic acid may be present in an amount of 0.1 wt % to 3 wt %.

A ratio of the amount of the first organic acid:the amount of the second organic acid may range from 2:1 to 10:1.

When the amount of the first organic acid and the amount of the second organic acid are below the above ranges, a complex compound may be insufficiently formed by reacting with remaining metal ions, which may result in a decrease in an effect of removing metal contaminants. When the amount of the first organic acid and the amount of the second organic acid exceed the above ranges, an organic acid added in excess may remain on a surface of a wafer, which may cause defects.

In addition, each of the first organic acid and the second organic acid may be included in the above-described amount, and thus a reaction of a formation of a complex compound with metal ions may be optimized.

In other words, the first organic acid and the second organic acid may simultaneously or separately react with metal ions that remain and that have different functional groups, to effectively form a complex compound.

The first organic acid may include at least one of malic acid, malonic acid, adipic acid, succinic acid, tartaric acid, glutaric acid, glycolic acid, aspartic acid, itaconic acid, glutamic acid, tricarballylic acid, pimelic acid, suberic acid, sebacic acid, stearic acid, pyruvic acid, acetoacetic acid, glyoxylic acid, azelaic acid, fumaric acid, glutaconic acid, traumatic acid, muconic acid, aconitic acid, carballylic acid, tribasic acid, mellitic acid, isocitric acid, citric acid, lactic acid, gluconic acid, maleic acid, ascorbic acid, iminoacetic acid, oxalic acid, pyrogallic acid, formic acid, acetic acid, propionic acid, butyric acid, valeric acid, hexanoic acid, heptanoic acid, caprylic acid, nonanoic acid, decanoic acid, undecylenic acid, lauric acid, tridecylic acid, myristic acid, pentadecanoic acid, palmitic acid, sulfamic acid, salicylic acid, p-toluenesulfonic acid, polystyrenesulfonic acid, 2-naphthalene sulfonic acid, polyvinylsulfonic acid, dodecylbenzenesulfonic acid, 4-hydroxybenzenesulfonic acid, methylsulfonic acid, and nitrobenzenesulfonic acid.

The second organic acid may include at least one of ethylidenediphosphonic acid, 1-hydroxyethylidene-1,1'-diphosphonic acid (HEDP), 1-hydroxypropylidene-1,1'-diphosphonic acid, 1-hydroxybutylidene-1,1'-diphosphonic acid, ethylaminobis(methylenephosphonic acid), dodecylaminobis(methylenephosphonic acid), 2-phosphono-butane-1,2,4-tricarboxylic acid (PBTC), nitrilotris(methylenephosphonic acid) (NTPO), ethylenediaminebis(methylenephosphonic acid) (EDDPO), 1,3-propylenediaminebis(methylenephosphonic acid), ethylenediaminetetra(methylenephosphonic acid) (EDTPO), ethylenediaminetetra(ethylenephosphonic acid), 1,3-acid) propylenediaminetetra(methylenephosphonic (PDTMP), 1,2-acid), diaminopropanetetra(methylenephosphonic 1,6-hexamethylenediaminetetra(methylenephosphonic acid), hexadiaminetetra(methylenephosphonic acid), diethylenetriaminepenta(methylenephosphonic acid) (DEPPO), diethylenetriaminepentakis(methylphosphonic acid), N,N,N',N'-ethylenediaminetetra(methylenephosphonic acid), diethylenetriaminepenta(ethylenephosphonic acid), triethylenetetraminehexa(methylenephosphonic acid), and triethylenetetraminehexa(ethylenephosphonic acid).

The etching agent including the fluoride compound may have a function of easily removing defects by applying an etching effect to a polished surface again in the cleaning process after polishing.

In addition, a loss of a film may be reduced, compared to when hydrogen fluoride (HF) is used.

In an example, in a cleaning process after a CMP process is performed using ceria particles, a surface of a silicon oxide film that is to be processed may be etched again and cleaned, and thus a loss of the silicon oxide film may be reduced and surface defects may be effectively removed.

The fluoride compound may include at least one of ammonium bifluoride, ammonium fluoride, sodium fluoride, barium fluoride, calcium fluoride, magnesium fluoride, potassium fluoride, aluminum fluoride, aminobenzotrifluoride, boron trifluoride, and cobalt fluoride.

The etching agent may be present in an amount of 0.1 wt % to 15 wt %.

The etching agent may desirably be present in an amount of 0.5 wt % to 10 wt %.

When the amount of the etching agent is below the above range, a surface defect removal function may be deteriorated due to an insignificant etching effect during cleaning. When the amount of the etching agent exceeds the above range, a film may be lost, or surface defects may increase due to the remaining etching agent.

The cleaning solution composition may further include an anionic surfactant including a sulfonate or a phosphate. The anionic surfactant may be present in an amount of 0.01 wt % to 10 wt %.

The anionic surfactant including the sulfonate or the phosphate may remove particles from a substrate through a mechanism by which the anionic surfactant is electrically adsorbed to the particles by lowering a zeta potential. Also, the anionic surfactant may prevent particles from being adsorbed again onto a surface of the substrate, thereby exhibiting an excellent cleaning effect. In particular, defects and cleaning for a hydrophilic film such as a silicon nitride film or a silicon oxide film may be improved.

The anionic surfactant may be present in an amount of 0.01 wt % to 10 wt %.

The anionic surfactant may be present desirably in an amount of 0.01 wt % to 8 wt %, more desirably in an amount of 0.05 wt % to 8 wt %, and even more desirably in an amount of 0.05 wt % to 7 wt %.

When the amount of the anionic surfactant is below the above range, particles may be insufficiently adsorbed, and accordingly the particles may not be electrically removed. When the amount of the anionic surfactant exceeds the above range, an effect over a certain effect may not be obtained even though an excessive amount of the anionic surfactant is used, which may be uneconomical and may cause particles to remain on a surface.

The sulfonate may include at least one of alkyl aryl sulfonate, alkylether sulfonate, alkyl sulfonate, arylsulfonate, polystyrene sulfonate, alkanesulfonate, α-olefin sulfonate, dodecylbenzenesulfonate, and alkylbenzenesulfonate.

The phosphate may include at least one of alkyl aryl phosphate, alkyl ether phosphate, aryl ether phosphate, alkyl phosphate, aryl phosphate, and benzene phosphate.

The cleaning solution composition may further include a pH adjusting agent, and the pH adjusting agent may include at least one of alkanolamine and hydroxylamine.

The pH adjusting agent may be a material used to adjust pH of the cleaning solution composition.

The pH adjusting agent may include at least one of monoethanolamine (MEA), mono-n-propanolamine, monoisopropanolamine, mono-n-butanolamine, monopentanolamine, monohexanolamine, monoheptanolamine, monooctanolamine, monononanolamine, monodecanolamine, diethanolamine (DEA), dipropanolamine, diisopropanolamine (DIPA), dibutanolamine, dipentanolamine, dihexanolamine, diheptanolamine, dioctanolamine, dinonanolamine, didecanolamine, N-methyldiethanolamine (MDEA), triethanolamine (TEA), triisopropanolamine (TIPA), tripentanolamine, trihexanolamine, triheptanolamine, trioctanolamine, trinonanolamine, tridecanolamine, 2-amino-2-methyl-propanol (AMP), 1-aminoisopropanol (AIP), 2-amino-1-propanol, N-methylaminoethanol (N-MAE), 3-amino-1-propanol, 4-amino-1-butanol, 2-(2-aminoethoxy)-1-ethanol (AEE), and 2-(2-aminoethylamino)-1-ethanol.

The pH adjusting agent may be used in an amount suitable for adjusting the pH to desired pH.

The pH of the cleaning solution composition may range from 2 to 7.

The range of the pH of the cleaning solution composition may be a range that enables a function of each of the chelating agent, the etching agent, and the anionic surfactant in the cleaning solution composition to be sufficiently exerted so that cleaning performance and a defect removal effect may be maximized. In addition, the range of the pH may give an effect of preventing particles from being adsorbed again due to repulsive properties of the particles against an electrical repulsive force between ceria particles and a surface of a wafer.

According to an example embodiment, the cleaning solution composition may include a solvent. The solvent may include either one or both of water and an organic solvent. Water in the cleaning solution composition may function to dissolve or disperse the other components in the cleaning solution composition. Desirably, water may contain impurities that inhibit actions of the other components, as little as possible. Specifically, ion-exchanged water, from which foreign materials are removed through a filter after removing impurity ions using an ion-exchange resin, pure water, ultrapure water, deionized water or distilled water may be desirable.

Cleaning may be performed after a surface of a wafer for a semiconductor device including at least one of a silicon nitride film and a silicon oxide film is polished.

In the cleaning solution composition, an etch rate of the silicon oxide film may range from 0.1 angstrom per minute (Å/min) to 10 Å/min at room temperature.

The etch rate may refer to a value obtained by dividing a difference between a thickness of the silicon oxide film before treatment with the cleaning solution composition and a thickness of the silicon oxide film after treatment with the cleaning solution composition, after the silicon oxide film is dipped in the cleaning solution composition for 60 minutes.

According to an example embodiment, based on defects of a wafer (including a silicon nitride film and a silicon oxide film) cleaned with a hydrofluoric acid and standard cleaning 1 (SC1) according to a related art, defects of the silicon oxide film cleaned with the cleaning solution composition may be reduced by 50% or greater, up to 76% or greater, and defects of the silicon nitride film cleaned with the cleaning solution composition may be reduced by 10% or greater, up to 87% or greater.

The SC1 may be a generally used cleaning solution, and may refer to a mixed cleaning solution of ammonia water, hydrogen peroxide, and water.

According to an example embodiment, the cleaning solution composition may be used for cleaning after polishing is performed using a CMP slurry including ceria.

In other words, after a polishing process is performed using a CMP slurry including ceria particles, the cleaning solution composition may be used for a subsequent process of cleaning residues.

The residues may be, for example, particles from a CMP slurry, chemical materials present in a CMP slurry, by-products of a CMP slurry, carbon-rich particles, polishing pad particles, brush deloading particles, equipment materials of construction particles, metals, metal oxides, or combinations thereof.

According to another aspect, a cleaning method including cleaning a wafer for a semiconductor device using the cleaning solution composition after CMP of the wafer may be provided.

The cleaning method may be performed at least one time using the cleaning solution composition alone. After pre-treatment with diluted hydrogen fluoride (DHF), the cleaning method may be performed using the cleaning solution composition.

The cleaning may be performed by directly contacting the cleaning solution composition to the wafer for the semiconductor device in the same apparatus and conditions as those used in general cleaning of a wafer.

The cleaning method may exhibit relatively high cleaning performance, compared to when a cleaning process is performed using a hydrofluoric acid and SC1 that are typically used, and may reduce a film loss and surface defects.

The cleaning solution composition may be free of hydrogen fluoride.

According to an example embodiment, the cleaning method may use the cleaning solution composition that is free of hydrogen fluoride, to reduce a film loss and surface defects and secure cleaning performance equal to or greater than cleaning performance obtained when hydrogen fluoride according to the related art is used as a cleaning solution.

Hereinafter, the present disclosure will be described in detail based on examples and comparative examples.

However, the following examples are provided only for purpose of illustrating the present disclosure, and should not be construed as limiting the present disclosure by the examples.

Experimental Example 1. Evaluation of Etch Rate

1) Evaluation of Etch Rate based on Etching Agent 3 wt % of an organic acid (for example, citric acid) having a carboxyl group and 1 wt % of an organic acid (for example, 1-hydroxyethylidene-1,1'-diphosphonic acid (HEDP), and etidronic acid) having a phosphoric acid group, as a chelating agent, and ammonium bifluoride (ABF) as an etching agent were mixed, and pH was adjusted to "5" using monoethanolamine as a pH adjusting agent, to prepare a cleaning solution composition.

As comparative examples, a cleaning solution composition including tetramethylammonium fluoride (TMAF) as an etching agent, and a cleaning solution composition to which an etching agent was not added were prepared.

An etch rate of a silicon oxide film (TEOS(tetraethylorthosilicate)) was evaluated using each of the prepared cleaning solution compositions.

First, an oxide wafer in 2 centimeters (cm)×2 cm was washed with deionized water (DIW) and dried, and a PRE thickness was measured using a reflectometer (manufactured by Filmetrics). After the PRE thickness was measured, the oxide wafer was dipped in each of the cleaning solution compositions at each temperature and each concentration for 60 minutes, washed and dried, and then a POST thickness was measured.

The etch rate was calculated by Equation 1 shown below.

Etch rate (Å/min)={PRE thickness (Å)−POST thickness (Å)}/Evaluation time (min)  [Equation 1]

A type and an amount of an etching agent in each of the cleaning solution compositions, a temperature condition, and an evaluated etch rate are shown in Table 1 below.

TABLE 1

| | Target film | Etching agent | Amount (wt %) | Temperature (° C.) | Dilution ratio | Etch rate (Å/min) |
|---|---|---|---|---|---|---|
| Comp. Ex. 1-1 | TEOS | — | — | 20 | 1/50 | 0.08 |
| Comp. Ex. 1-2 | TEOS | — | — | 60 | 1/50 | 0.10 |
| Comp. Ex. 1-3 | TEOS | — | — | 80 | 1/50 | 0.14 |
| Comp. Ex. 1-4 | TEOS | TMAF | 1 | 20 | 1/50 | 0.05 |
| Comp. Ex. 1-5 | TEOS | TMAF | 2 | 20 | 1/50 | 0.08 |
| Comp. Ex. 1-6 | TEOS | TMAF | 5 | 20 | 1/50 | 0.06 |
| Ex. 1-1 | TEOS | ABF | 2 | 20 | 1/50 | 0.41 |
| Ex. 1-2 | TEOS | ABF | 10 | 20 | 1/50 | 7.50 |
| Ex. 1-3 | TEOS | ABF | 5 | 20 | 1/50 | 1.51 |
| Ex. 1-4 | TEOS | ABF | 5 | 40 | 1/50 | 2.42 |
| Ex. 1-5 | TEOS | ABF | 5 | 60 | 1/50 | 3.43 |
| Ex. 1-6 | TEOS | ABF | 5 | 80 | 1/50 | 3.44 |
| Ex. 1-7 | TEOS | AF | 1 | 20 | 1/50 | 0.06 |
| Ex. 1-8 | TEOS | AF | 5 | 20 | 1/50 | 1.73 |
| Ex. 1-9 | TEOS | AF | 10 | 20 | 1/50 | 7.13 |

Referring to Table 1, it may be confirmed that when an etching agent was not used in Comparative Examples 1-1 to 1-3 or when TMAF was used as an etching agent in Comparative Examples 1-4 to 1-6, the etch rate insignificantly changes according to the temperature or the amount of the etching agent. On the contrary, it may be confirmed that when an etching agent according to an example embodiment was used in Examples 1-1 to 1-9, the etch rate significantly increases based on an increase in the temperature or the amount of the etching agent.

2) Evaluation of Etch Rate Trend according to Dilution Ratio

A degree of etching according to a dilution ratio of 5 wt % of an ABF solution to a cleaning solution composition of Example 1-3 was measured at room temperature (RT) and 60° C. Measurement results are shown in Table 2 below.

TABLE 2

| Dilution ratio | Etching agent (wt %) | Etch rate (Å/min) for 5 wt % ABF | | Etch rate (Å/min) for Example 1-3 | |
|---|---|---|---|---|---|
| | | RT | 60° C. | RT | 60° C. |
| 1 | 5 | 582.6 | 5343.8 | 564.8 | 4675.1 |
| 1/1.7 | 3 | 334.0 | 3372.4 | 317.9 | 2676.1 |
| 1/5 | 1 | 86.7 | 814.5 | 62.7 | 501.7 |
| 1/10 | 0.5 | 31.3 | 276.72 | 23.5 | 144.7 |
| 1/25 | 0.2 | 8.4 | 32.22 | 6.1 | 20.2 |
| 1/50 | 0.1 | 2.4 | 6.93 | 1.5 | 3.4 |
| 1/75 | 0.07 | 1.2 | 2.58 | 0.7 | 1.7 |

FIG. 1 is a graph illustrating an etch amount according to a dilution ratio of 5 wt % of the ABF solution and the cleaning solution composition of Example 1-3 at room temperature.

Figure 2:
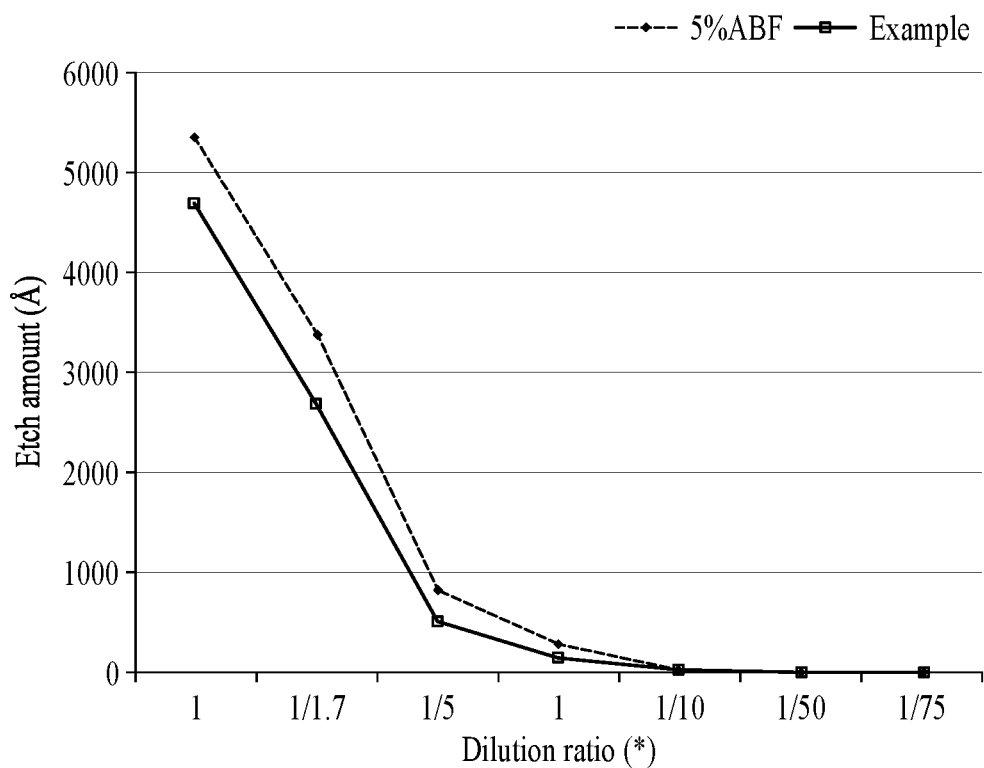
FIG. 2 is a graph illustrating an etch amount according to a dilution ratio of 5 wt % of the ABF solution and the cleaning solution composition of Example 1-3 at 60° C.

FIG. 2 is a graph illustrating an etch amount according to a dilution ratio of 5 wt % of the ABF solution and the cleaning solution composition of Example 1-3 at 60° C.

Referring to Table 2, and FIGS. 1 and 2, it may be confirmed that under room temperature and 60° C., the etch amounts decrease in similar manners according to an increase in the dilution ratio of 5 wt % of the ABF solution and the cleaning solution composition of Example 1-3. Thus, it may be found that when ABF is included in the cleaning solution composition, performance of etching an oxide film may be maintained without a change in stability.

Experimental Example 2. Defect Removal Effect

CMP of a wafer was performed at a pressure of 2 psi for 10 seconds using a polishing slurry including ceria particles with a diameter of 100 nanometers (nm). The completely polished wafer was applied to each of brush 1 and brush 2 using the cleaning solution compositions of the examples and comparative examples, and was cleaned.

After the wafer was cleaned, defects were measured using defect measurement equipment (manufactured by KLA-Tencor) and confirmed, and a defect removal rate was calculated by Equation 2 shown below.

Defect removal rate (%)={1−(Number of defects/Number of defects in Comparative Example 1)}*100

A composition of each of the used cleaning solution compositions of the examples and comparative examples, and measured defect removal rates are shown in Tables 3 and 4 below.

TABLE 3

| | Brush 1 | pH | Chelating agent 1 (wt %) | Chelating agent 2 (wt %) | Etching agent (wt %) | pH adjusting agent | Dilution ratio |
|---|---|---|---|---|---|---|---|
| | | | In-situ cleaning process | | | | |
| | | | Brush 2 | | | | |
| Comp. Ex. 2-1 | 1% hydrofluoric acid | | | SC1 | | | |
| Comp. Ex. 2-2 | 1% hydrofluoric acid | 5 | Citric acid 3% | HEDP 1% | TMAF 1% | MEA | 1/50 |
| Comp. Ex. 2-3 | 1% hydrofluoric acid | 5 | Citric acid 3% | HEDP 1% | TMAF 2% | MEA | 1/50 |
| Comp. Ex. 2-4 | 1% hydrofluoric acid | 5 | Citric acid 3% | HEDP 1% | TMAF 5% | MEA | 1/50 |
| Ex. 2-1 | 1% hydrofluoric acid | 5 | Citric acid 3% | HEDP 1% | ABF 5% | MEA | 1/50 |
| Ex. 2-2 | 1% hydrofluoric acid | 5 | Citric acid 3% | HEDP 1% | ABF 2% | MEA | 1/50 |
| Ex. 2-3 | 1% hydrofluoric acid | 5 | Citric acid 3% | HEDP 1% | ABF 10% | MEA | 1/50 |
| Ex. 2-4 | 1% hydrofluoric acid | 4 | Citric acid 3% | HEDP 1% | AF 5% | MEA | 1/50 |

TABLE 4

| | Defect removal rate (%) | | | |
|---|---|---|---|---|
| | Nitride (≥52 nm) | | Oxide (≥52 nm) | |
| Comp. Ex. 2-1 | 2,305 | 0.0% | 1065 | 0.0% |
| Comp. Ex. 2-2 | 2008 | 12.9% | 1688 | −58.5% |
| Comp. Ex. 2-3 | 2100 | 8.9% | 1147 | −7.7% |
| Comp. Ex. 2-4 | — | — | 1833 | −72.1% |
| Ex. 2-1 | 537 | 76.7% | 134 | 87.4% |
| Ex. 2-2 | 754 | 67.3% | 637 | 40.2% |
| Ex. 2-3 | 925 | 59.9% | 958 | 10.0% |
| Ex. 2-4 | 628 | 72.8% | 432 | 59.4% |

Referring to Tables 3 and 4, it may be confirmed that defect removal rates for a nitride film and an oxide film were significantly increased in Examples 2-1 to 2-4, based on Comparative Example 2-1 in which SC1 was used, and that in Example 2-1, a defect removal rate for the nitride film and a defect removal rate for the oxide film were increased to 76.7% and 87.4%, respectively.

In comparison, it may be confirmed that in Comparative Examples 2-2 to 2-4 in which TMAF was used as an etching agent, measured defect removal rates were not greatly increased based on Comparative Example 2-1 in which SC1 was used, and that a number of defects of the oxide film was increased.

While this disclosure includes specific example embodiments, it will be apparent to one of ordinary skill in the art that various changes in form and details may be made in these example embodiments without departing from the spirit and scope of the claims and their equivalents. The example embodiments described herein are to be considered in a descriptive sense only, and not for purposes of limitation. Descriptions of features or aspects in each example embodiment are to be considered as being applicable to similar features or aspects in other example embodiments. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is not limited by the detailed description, but further supported by the claims and their equivalents, and all variations within the scope of the claims and their equivalents are to be construed as being included in the disclosure.

What is claimed is:

1. A cleaning solution composition comprising:
   a chelating agent comprising a first organic acid and a second organic acid; and
   an etching agent comprising a fluoride compound,
   wherein the etching agent is present in an amount of 0.5 by weight (wt %) to 10 wt %, and
   the fluoride compound comprises at least one selected from a group consisting of ammonium bifluoride, ammonium fluoride, sodium fluoride, barium fluoride, calcium fluoride, magnesium fluoride, potassium fluoride, aluminum fluoride, aminobenzotrifluoride, boron trifluoride, and cobalt fluoride.

2. The cleaning solution composition of claim 1, wherein the first organic acid comprises a carboxyl group or a sulfonic acid group, and
   the second organic acid comprises a phosphoric acid group.

3. The cleaning solution composition of claim 1, wherein the first organic acid is present in an amount of 1 wt % to 10 wt %, and
   the second organic acid is present in an amount of 0.01 wt % to 5 wt %.

4. The cleaning solution composition of claim 1, wherein the first organic acid comprises at least one selected from a group consisting of malic acid, malonic acid, adipic acid, succinic acid, tartaric acid, glutaric acid, glycolic acid, aspartic acid, itaconic acid, glutamic acid, tricarballylic acid, pimelic acid, suberic acid, sebacic acid, stearic acid, pyruvic acid, acetoacetic acid, glyoxylic acid, azelaic acid, fumaric acid, glutaconic acid, traumatic acid, muconic acid, aconitic acid, carballylic acid, tribasic acid, mellitic acid, isocitric acid, citric acid, lactic acid, gluconic acid, maleic acid, ascorbic acid, iminoacetic acid, oxalic acid, pyrogallic acid, formic acid, acetic acid, propionic acid, butyric acid, valeric acid, hexanoic acid, heptanoic acid, caprylic acid, nonanoic acid, decanoic acid, undecylenic acid, lauric acid, tridecylic acid, myristic acid, pentadecanoic acid, palmitic acid, sulfamic acid, salicylic acid, p-toluenesulfonic acid, polystyrenesulfonic acid, 2-naphthalene sulfonic acid, polyvinylsulfonic acid, dodecylbenzenesulfonic acid, 4-hydroxybenzenesulfonic acid, methylsulfonic acid, and nitrobenzenesulfonic acid.

5. The cleaning solution composition of claim 1, wherein the second organic acid comprises at least one selected from a group consisting of ethylidenediphosphonic acid, 1-hydroxyethylidene-1,1'-diphosphonic acid (HEDP), hydroxypropylidene-1,1'-diphosphonic acid, 1-hydroxybutylidene-1,1'-diphosphonic acid, ethylaminobis(methylenephosphonic acid), dodecylaminobis(methylenephosphonic acid), 2-phosphono-butane-1,2,4-tricarboxylic acid (PBTC), nitrilotris(methylenephosphonic acid) (NTPO), ethylenediaminebis(methylenephosphonic acid) (EDDPO), 1,3-propylenediaminebis(methylenephosphonic acid), ethylenediaminetetra(methylenephosphonic acid) (EDTPO), ethylenediaminetetra(ethylenephosphonic acid), 1,3-propylenediaminetetra(methylenephosphonic acid) (PDTMP), 1,2-diaminopropanetetra(methylenephosphonic acid), 1,6-hexamethylenediaminetetra(methylenephosphonic acid), hexadiaminetetra(methylenephosphonic acid), diethylenetriaminepenta(methylenephosphonic acid) (DEPPO), diethylenetriaminepentakis(methylphosphonic acid), N,N,N',N'-ethylenediaminetetra(methylenephosphonic acid), diethylenetriaminepenta(ethylenephosphonic acid), triethylenetetraminehexa(methylenephosphonic acid), and triethylenetetraminehexa(ethylenephosphonic acid).

6. The cleaning solution composition of claim 1, further comprising:
an anionic surfactant comprising a sulfonate or a phosphate,
wherein the anionic surfactant is present in an amount of 0.01 wt % to 10 wt %.

7. The cleaning solution composition of claim 6, wherein the sulfonate comprises at least one selected from a group consisting of alkyl aryl sulfonate, alkylether sulfonate, alkyl sulfonate, arylsulfonate, polystyrene sulfonate, alkanesulfonate, α-olefin sulfonate, dodecylbenzenesulfonate, and alkylbenzenesulfonate.

8. The cleaning solution composition of claim 6, wherein the phosphate comprises at least one selected from a group consisting of alkyl aryl phosphate, alkyl ether phosphate, aryl ether phosphate, alkyl phosphate, aryl phosphate, and benzene phosphate.

9. The cleaning solution composition of claim 1, further comprising:
a pH adjusting agent,
wherein the pH adjusting agent comprises at least one of alkanolamine and hydroxylamine.

10. The cleaning solution composition of claim 9, wherein the pH adjusting agent comprises at least one selected from a group consisting of monoethanolamine (MEA), mono-n-propanolamine, monoisopropanolamine, mono-n-butanolamine, monopentanolamine, monohexanolamine, monoheptanolamine, monooctanolamine, mononanolamine, monodecanolamine, diethanolamine (DEA), dipropanolamine, diisopropanolamine (DIPA), dibutanolamine, dipentanolamine, dihexanolamine, diheptanolamine, dioctanolamine, dinonanolamine, didecanolamine, N-methyldiethanolamine (MDEA), triethanolamine (TEA), triisopropanolamine (TIPA), tripentanolamine, trihexanolamine, triheptanolamine, trioctanolamine, trinonanolamine, tridecanolamine, 2-amino-2-methyl-propanol (AMP), 1-aminoisopropanol (AIP), 2-amino-1-propanol, N-methylaminoethanol (N-MAE), 3-amino-1-propanol, 4-amino-1-butanol, 2-(2-aminoethoxy)-1-ethanol (AEE), and 2-(2-aminoethylamino)-1-ethanol.

11. The cleaning solution composition of claim 1, wherein pH of the cleaning solution composition ranges from 2 to 7.

12. The cleaning solution composition of claim 1, wherein cleaning is performed after a surface of a wafer for a semiconductor device comprising at least one of a silicon nitride film and a silicon oxide film is polished.

13. The cleaning solution composition of claim 1, wherein the cleaning solution composition is used for cleaning after polishing is performed using a chemical mechanical polishing (CMP) slurry comprising ceria.

14. A cleaning method comprising:
cleaning a wafer for a semiconductor device using the cleaning solution composition of claim 1 after chemical mechanical polishing (CMP) of the wafer.

15. The cleaning method of claim 14, wherein the cleaning solution composition is free of hydrogen fluoride.

* * * * *